US012191188B2

(12) United States Patent
Amikura et al.

(10) Patent No.: US 12,191,188 B2
(45) Date of Patent: Jan. 7, 2025

(54) TRANSFER DEVICE, TRANSFER SYSTEM, AND END EFFECTOR

(71) Applicant: Tokyo Electron Limited, Tokyo (JP)

(72) Inventors: Norihiko Amikura, Miyagi (JP);
Masatomo Kita, Miyagi (JP);
Masahiro Dogome, Miyagi (JP);
Takami Fukasawa, Yamanashi (JP);
Daisuke Hayashi, Yamanashi (JP);
Toshiaki Toyomaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 627 days.

(21) Appl. No.: 17/402,640

(22) Filed: Aug. 16, 2021

(65) Prior Publication Data

US 2022/0051928 A1 Feb. 17, 2022

(30) Foreign Application Priority Data

Aug. 17, 2020 (JP) .................................. 2020-137580
Jul. 14, 2021 (JP) .................................. 2021-116625

(51) Int. Cl.
*H01L 21/687* (2006.01)
*B25J 11/00* (2006.01)
*H01L 21/683* (2006.01)

(52) U.S. Cl.
CPC ..... *H01L 21/68707* (2013.01); *B25J 11/0095* (2013.01); *H01L 21/6831* (2013.01); *H01L 21/6835* (2013.01); *H01L 21/6838* (2013.01)

(58) Field of Classification Search
CPC ............... B25J 11/0095; B25J 15/0014; H01L 21/67742; H01L 21/68707; H01L 21/683; H01L 21/6835
See application file for complete search history.

(56) References Cited

U.S. PATENT DOCUMENTS 5,711,647 A * 1/1998 Slocum .................... B23Q 7/04
414/941
6,109,677 A * 8/2000 Anthony ........... H01L 21/67706
414/941

(Continued)

FOREIGN PATENT DOCUMENTS

JP 2020-96149 A 6/2020
KR 20110013551 A * 2/2011
TW 201725101 A 7/2017

*Primary Examiner* — Dean J Kramer
(74) *Attorney, Agent, or Firm* — XSENSUS LLP

(57) ABSTRACT

A transfer device for simultaneously or separately transferring a wafer and a consumable part having a circular shape is disclosed. The consumable part is disposed in a wafer processing module, and the outer diameter of the consumable part is larger than the outer diameter of the wafer. The transfer device comprises an end effector configured to place the wafer and the consumable part thereon simultaneously or separately, an arm configured to move the end effector, and a controller configured to control the arm, to place the consumable part on the end effector such that the center of gravity of the consumable part coincides with a first position when transferring the consumable part, and to place the wafer on the end effector such that the center of gravity of the wafer coincides with a second position between the first position and front ends of the end effector when transferring the wafer.

14 Claims, 10 Drawing Sheets

(56) References Cited

U.S. PATENT DOCUMENTS

| | | | | |
|---|---|---|---|---|
| 6,152,677 | A * | 11/2000 | Tateyama | H01L 21/67742 414/737 |
| 7,641,247 | B2 * | 1/2010 | Blonigan | H01L 21/68707 294/902 |
| 9,776,333 | B2 * | 10/2017 | Sakai | B25J 11/0095 |
| 9,779,977 | B2 * | 10/2017 | Embertson | H01L 21/68707 |
| 10,460,976 | B2 * | 10/2019 | Morikawa | H01L 21/67778 |
| 2017/0117172 | A1 * | 4/2017 | Genetti | H01L 21/68707 |
| 2020/0194296 | A1 * | 6/2020 | Numakura | H01L 21/6831 |

* cited by examiner

TRANSFER DEVICE, TRANSFER SYSTEM, AND END EFFECTOR

CROSS-REFERENCE TO RELATED APPLICATIONS

This application claims priority to and the benefit of Japanese Patent Application Nos. 2020-137580 and 2021-116625, respectively filed on Aug. 17, 2020 and Jul. 14, 2021, the disclosure of each are incorporated herein by reference in its entirety.

TECHNICAL FIELD

Various aspects and embodiments of the present disclosure relate to a transfer device, a transfer system, and an end effector.

BACKGROUND

For example, Japanese Patent Application Publication No. 2020-96149 discloses a transfer device for transferring a consumable part in a processing apparatus as well as a wafer. Accordingly, the consumable part can be replaced without opening a chamber of the processing apparatus to the atmosphere, thereby reducing a time period of suspending the operation of the processing apparatus which performs the processing at a low pressure.

SUMMARY

The present disclosure provides a transfer device, a transfer system, and an end effector capable of reducing a footprint of an entire system including the transfer device.

A transfer device according to one aspect of the present disclosure simultaneously or separately transfers a wafer and a consumable part having a circular shape. The consumable part can be disposed in a wafer processing module, and the outer diameter of the consumable part is larger than the outer diameter of the wafer. The transfer device comprises an end effector configured to place the wafer and the consumable part thereon simultaneously or separately, an arm configured to move the end effector, and a controller configured to control the arm, to place the consumable part on the end effector such that the center of gravity of the consumable part coincides with a first position, in the case of transferring the consumable part, and to place the wafer on the end effector such that the center of gravity of the wafer coincides with a second position between the first position and front ends of the end effector, in the case of transferring the wafer.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a transfer device, a transfer system, and an end effector will be described in detail with reference to the accompanying drawings. Further, the following embodiments are not intended to limit the transfer device, the transfer system, and the end effector of the present disclosure.

In the case of transferring a wafer or a consumable part, the wafer or the consumable part is placed on an end effector such that the center of gravity thereof is located at a predetermined position on an end effector disposed at a front end of a robot arm. When the consumable part is a ring-shaped component, e.g., an edge ring or the like, and is bigger than the wafer, if the consumable part is placed too close to the front end side of the end effector, the consumable part may fall from the end effector by the movement of the end effector. Therefore, it is necessary to prevent the position of the consumable part from being placed too close to the front ends of the end effector. Accordingly, the consumable part is placed on the end effector such that the center of gravity of the consumable part is away from the front ends of the end effector.

On the other hand, in the case of transferring a wafer which is smaller than the consumable part, if the wafer is placed on the end effector such that the center of gravity of the wafer coincides with the center of gravity of the consumable part at the time of transferring the consumable part, the front ends of the end effector will protrude from under the wafer. If the portion of the end effector protruding from under the wafer is large, the end effector will become obstructive at the time of transferring the wafer into an apparatus that has no space for accommodating the consumable part, which makes it difficult to load the wafer to a predetermined position in the apparatus.

In order to load the wafer into the predetermined position in the apparatus without being obstructed by the end effector, one may consider increasing the space in the apparatus that has no space for accommodating the consumable part. In such case, however, the footprint of the apparatus will increase and, thus, the footprint of the entire system will also increase.

Accordingly, the present disclosure provides a technique capable of reducing the footprint of the entire system including the transfer device.

First Embodiment (Configuration of Processing System 1)

Figure 1:
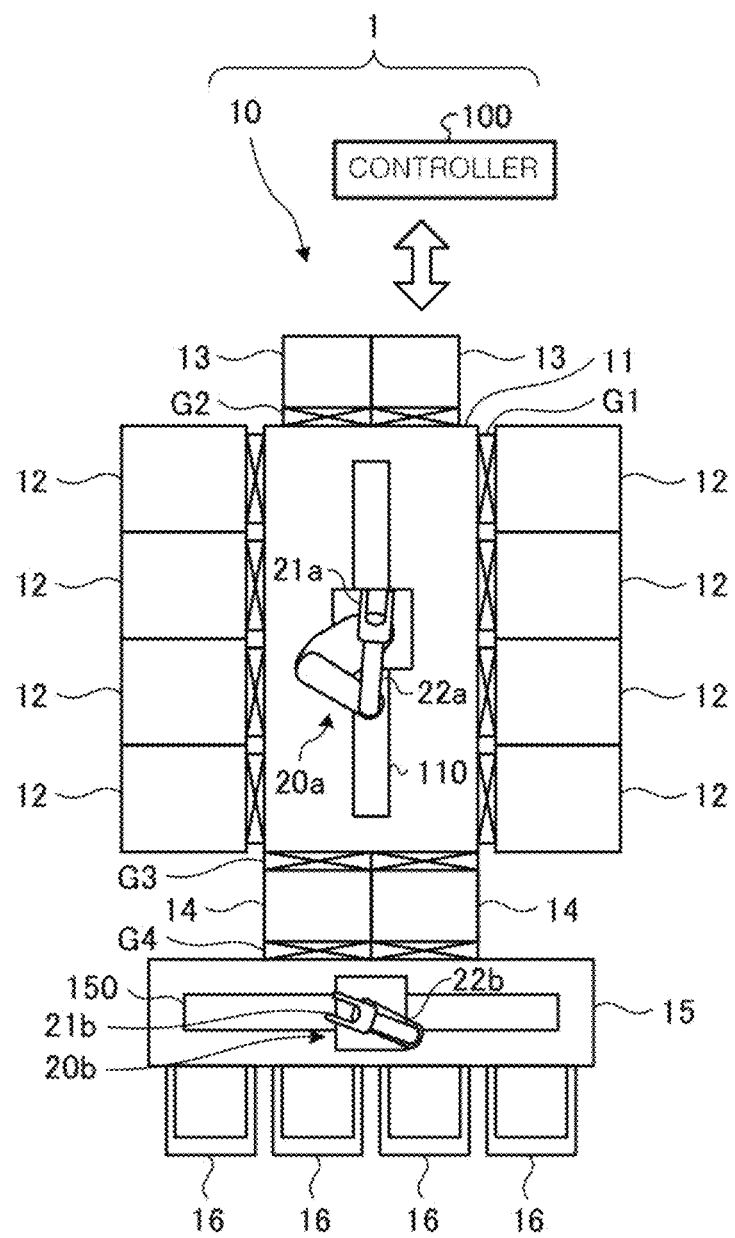
FIG. 1 is a top view showing an example of a processing system according to an embodiment.

FIG. 1 is a top view showing an example of a configuration of a processing system 1 according to an embodiment. In FIG. 1, some of the internal components of the apparatus are illustrated transparently for the sake of convenience. The processing system 1 comprises an apparatus main body 10 and a controller 100 for controlling the apparatus main body 10.

The apparatus main body 10 includes a vacuum transfer module 11, a plurality of processing modules 12, a plurality of ashing modules 13, a plurality of load-lock modules 14, and an atmospheric transfer module 15. The plurality of processing modules 12 are connected to two opposing sidewalls of the vacuum transfer module 11 through gate valves G1. The processing module 12 is an example of a processing apparatus. In the example of FIG. 1, eight processing modules 12 are connected to the vacuum transfer module 11. However, the number of the processing modules 12 connected to the vacuum transfer module 11 may be seven or less, or nine or more. Each of the processing modules 12 is an example of a first wafer processing module.

Figure 2:
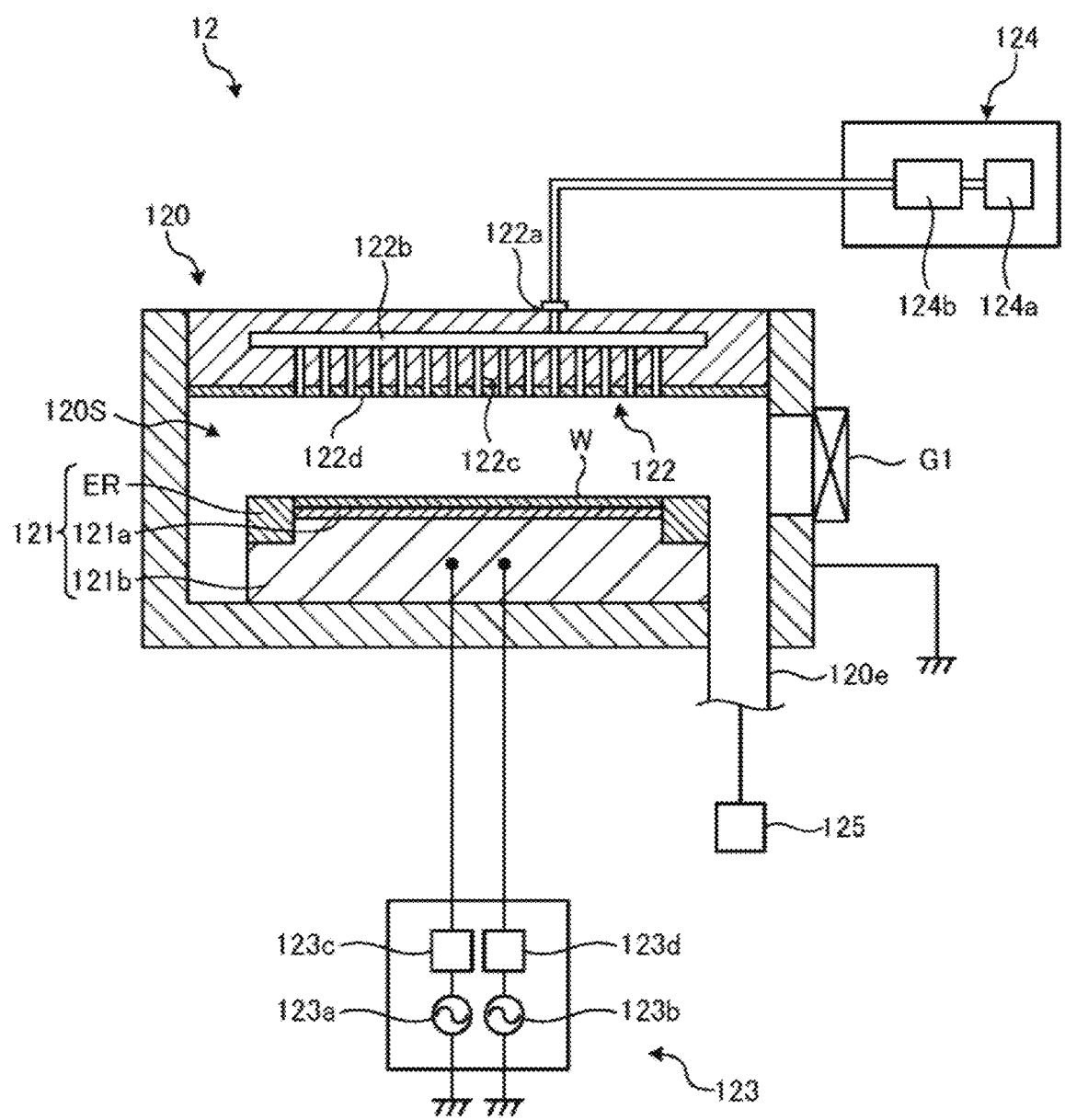
FIG. 2 is a schematic cross-sectional view representing an example of a processing module.

Each of the processing modules 12 performs processing such as etching, film formation, or the like on a wafer W to be processed. FIG. 2 is a schematic cross-sectional view showing an example of the processing module 12. The processing modules 12 include a chamber 120, a radio frequency (RF) power supply unit 123, a gas supply unit 124, and an exhaust system 125.

An opening is formed on a sidewall of the chamber 120, and is opened and closed by the gate valve G1. The chamber 120 includes a supporting unit 121 and an upper shower head assembly 122. The supporting unit 121 is disposed in a lower region of a processing space 120S in the chamber 120. The upper shower head assembly 122 is disposed above the supporting unit 121, and may function as a part of a ceiling plate of the chamber 120.

The supporting unit 121 is configured to support the wafer W in the processing space 120S. In the present embodiment, the supporting unit 121 includes an edge ring ER, an electrostatic chuck 121a, and a lower electrode 121b. The electrostatic chuck 121a is disposed on the lower electrode 121b, and is configured to support the wafer W on an upper surface thereof. In the present embodiment, the shape of the electrostatic chuck 121a is circular. The electrostatic chuck 121a is an example of a consumable part. The edge ring ER is formed in an annular shape and is disposed on an upper peripheral surface of the lower electrode 121b. The edge ring ER is disposed to surround the electrostatic chuck 121a and the wafer W on the upper peripheral surfaces of the lower electrode 121b. In the present embodiment, the shape of the edge ring ER is circular. The edge ring ER is an example of the consumable part and an example of an annular shape part.

The upper shower head assembly 122 is configured to supply one or more types of gases from the gas supply unit 124 into the processing space 120S. A cover member 122d is detachably provided on a lower surface of the upper shower head assembly 122. In the present embodiment, the shape of the cover member 122d is circular. The cover member 122d is an example of the consumable part. In the present embodiment, the upper shower head assembly 122 includes a gas inlet 122a and a gas diffusion space 122b. A plurality of gas outlets 122c are formed at the upper shower head assembly 122, and the gas diffusion space 122b and the processing space 120S are in fluidic communication with each other through the plurality of gas outlets 122. In the present embodiment, the upper shower head assembly 122 is configured to supply one or more gases from the gas inlet 122a into the processing space 120S through the gas diffusion space 122b and the gas outlets 122c.

The gas supply unit 124 includes a gas source 124a and a flow rate controller 124b. The gas source 124a is a source of a processing gas such as an etching gas, a film forming gas, or the like. The flow rate controller 124b may include, e.g., a mass flow controller or a pressure-controlled flow controller. Further, the gas supply unit 124 may include one or more flow rate modulation devices for modulating the gas flow of one or more processing gases or causing it to pulsate.

The RF power supply unit 123 is configured to supply one or more RF powers, for example, to one or more electrodes such as the lower electrode 121b or the upper shower head assembly 122, or both the lower electrode 121b and the upper shower head assembly 122. In the present embodiment, the RF power supply unit 123 includes two RF generator 123a and 123b and two matching units 123c and 123d. In the present embodiment, the RF power supply unit 123 is configured to supply a first RF power from the RF generator 123a to the lower electrode 121b through the matching unit 123c. An RF spectrum includes a part of an electromagnetic spectrum ranging from 3 Hz to 3000 GHz. In an electronic material process such as a semiconductor process, the frequency of the RF spectrum used for plasma generation is preferably within a range of 100 kHz to 3 GHz, and more preferably within a range of 200 kHz to 150 MHz. For example, the frequency of the first RF power may be within a range of 27 MHz to 100 MHz.

Further, the RF power supply unit 123 of the present embodiment is configured to supply a second RF power from the RF generator 123b to the lower electrode 121b through the matching unit 123d. For example, the frequency of the second RF power may be within a range of 400 kHz to 13.56 MHz. Alternatively, the RF power supply unit 123 may have a direct current (DC) pulse generator, instead of the RF generator 123b.

Although it is not illustrated, other embodiments of the present disclosure may be considered. For example, in the RF power supply unit 123 of an alternative embodiment, one RF generator may be configured to supply the first RF power to the lower electrode 121b and another RF generator may be configured to supply the second RF power to the lower electrode 121b. Further, still another RF generator may be configured to supply a third RF power to the upper electrode showerhead assembly 122. In another alternative embodiment, a DC voltage may be applied to the upper electrode showerhead assembly 122. In various embodiments, amplitudes of one or more RF powers (i.e., first RF power, second RF power, and the like) may pulsate or be modulated. The amplitude modulation may include causing the RF signal amplitude to pulsate between ON and OFF states or between multiple different ON states. Further, the phase matching of the RF powers may be controlled, and the phase matching of the amplitude modulation of multiple RF powers may be synchronized or asynchronous.

The exhaust system 125 is connected to, for example, an exhaust port 120e disposed at a bottom portion of the chamber 120. The exhaust system 125 may include a vacuum pump, such as a pressure valve, a turbo molecular pump, a roughing vacuum pump, or a combination thereof.

Figure 3:
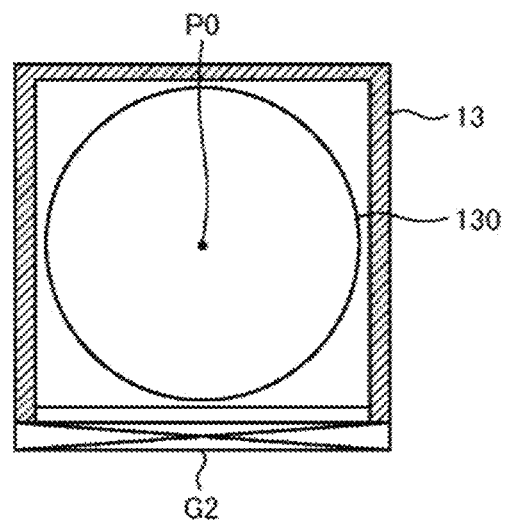
FIG. 3 shows an example of an ashing module.

Referring back to FIG. 1, the plurality of ashing modules 13 are connected to one of the two remaining sidewalls of the vacuum transfer module 11 through gate valves G2. Each of ashing modules 13 is an example of a second wafer processing module. The ashing module 13 removes a mask remaining on the wafer W that has been processed by the processing module 12 by ashing. As shown in FIG. 3, for example, a stage 130 on which the wafer W is to be placed is disposed in the ashing module 13. A position P0 indicates the center of gravity of the stage 130. In the case of loading the wafer W into the ashing module 13, the wafer W is placed on the stage 130 such that the center of gravity of the wafer W coincides with the position P0 of the stage 130. Although two ashing modules 13 are connected to the vacuum transfer module 11 in the example of FIG. 1, the number of ashing modules 13 connected to the vacuum transfer module 11 may be one, or may be three or more.

The load-lock modules 14 are connected to the other one of the two remaining sidewalls of the vacuum transfer module 11 through gate valves G3. In the example of FIG. 1, two load-lock module 14 are connected to the vacuum transfer module 11. However, the number of load-lock modules 14 connected to the vacuum transfer unit 11 may be one, or may be three or more. Further, at least one of the two load-lock modules 14 can accommodate the wafer W and the edge ring ER.

A transfer robot 20a is disposed in the vacuum transfer module 11. The transfer robot 20a has an end effector 21a and an arm 22a. The wafer W and the edge ring ER are placed on the end effector 21a. The arm 22a moves the end Effector 21a. The transfer robot 20a moves in the vacuum transfer module 11 along a guide rail 110 disposed in the vacuum transfer module 11, and transfers the wafer W between the processing module 12, the ashing module 13, and the load-lock module 14. Further, the transfer robot 20a may be fixed to a predetermined position in the vacuum transfer module 11 so that it does not move in the vacuum transfer module 11. The transfer robot 20a is an example of the transfer device and a vacuum transfer robot. A pressure in the vacuum transfer module 11 is maintained at a pressure lower than the atmospheric pressure.

For each of the load-lock modules 14, the vacuum transfer module 11 is connected to one of its sidewalls through the gate valves G3, and an atmospheric transfer module 15 is connected to another one of its sidewalls through gate valves G4. When the wafer W is loaded into the load-lock module 14 from the atmospheric transfer module 15 through the gate valve G4, the gate valve G4 is closed and the pressure in the load-lock module 14 is reduced from the atmospheric pressure to a predetermined pressure. Then, the gate valve G3 is opened, and the wafer W is unloaded from the load-lock module 14 to the vacuum transfer module 11 by the transfer robot 20a.

Further, in a state where the pressure in the load-lock module 14 is maintained at a pressure lower than the atmospheric pressure, the wafer W is loaded from the vacuum transfer module 11 into the load-lock module 14 through the gate valve G3 by the transfer robot 20a and, then, the gate valve G3 is closed. Then, the pressure in the load-lock module 14 is increased to the atmospheric pressure. Next, the gate valve G4 is opened, and the wafer W is unloaded from the load-lock module 14 to the atmospheric transfer module 15. The same procedure is carried out in the case of the loading and unloading of the edge ring ER.

On the sidewall of the atmospheric transfer module 15 opposite to the sidewall where the gate valves G4 are disposed, are disposed a plurality of load ports 16. A container such as a front opening unified pod (FOUP) capable of accommodating a plurality of wafers W is connected to each of the load ports 16. The atmospheric transfer module 15 may be provided with an aligner module for changing the orientation of the wafer W. Further, a container capable of accommodating an edge ring ER is connected to one of the load ports 16.

A transfer robot 20b is disposed in the atmospheric transfer module 15, which has an end effector 21b and an arm 22b. The transfer robot 20b is an example of an atmospheric transfer robot, and the end effector 21b included in the transfer robot 20b is an example of an additional end effector. The pressure in the atmosphere transfer module 15 is the atmospheric pressure. The transfer robot 20b in the atmospheric transfer module 15 moves in the atmospheric transfer module 15 along a guide rail 150 and transfers the wafer W and the edge ring ER between the load-lock module 14 and a container connected to the load port 16. The transfer robot 20b may be fixed to a predetermined position in the atmospheric transfer module 15 such that it does not move in the atmospheric transfer module 15. A fan filter unit (FFU) or the like is disposed at an upper portion of the atmospheric transfer module 15 so as to supply air into the atmospheric transfer module 15 after removing particles and the like therefrom to generate downflow in the atmospheric transfer module 15. In the present embodiment, the pressure in the atmospheric transfer module 15 is maintained in an atmospheric environment. However, in another embodiment, the pressure in the atmospheric transfer module 15 may be controlled to a positive pressure, such that intrusion of particles and the like from the outside into the atmospheric transfer module 16 can be suppressed.

The controller 100 includes a memory, a processor, and an input/output interface. A program or data such as a recipe or the like is stored in the memory. The memory is, e.g., a random access memory (RAM), a read only memory (ROM), a hard disk drive (HDD), a solid state drive (SSD), or the like. The processor controls individual components of the apparatus main body 10 through the input/output interface based on the data such as the recipe stored in the memory by executing the program read out from the memory. The processor is a central processing unit (CPU), a digital signal processor (DSP), or the like.

(Specific Description of End Effector 21)

Figure 4:
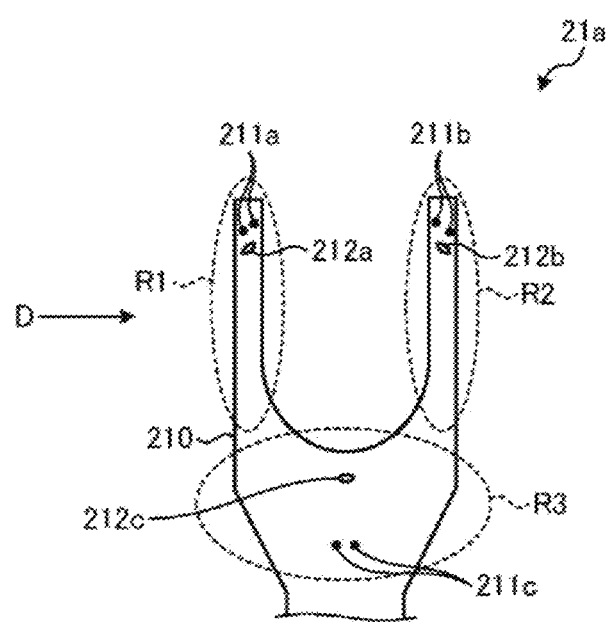
FIG. 4 is a top view describing an example of an end effector according to a first embodiment.

FIG. 4 is a top view showing an example of the end effector 21a according to the first embodiment. Although FIG. 4 illustrates the end effector 21a included in the transfer robot 20a, the end effector 21b included in the transfer robot 20b has the same configuration. The end effector 21a includes a main body 210 having an upper surface, a plurality of first holders 211a to 211c disposed on the upper surface of the main body 210, and a plurality of second holders 212a to 212c disposed on the upper surface of the main body 210. Each of the first holders 211a to 211c is formed of an elastic member such as rubber and holds the edge ring ER. Each of the second holders 212a to 212c is formed of an elastic member such as rubber and holds the wafer W. Each of the plurality of first holders 211a to 211c is an example of a consumable part support pad. Each of the plurality of second holders 212a to 212c is an example of a wafer support pad.

The main body 210 has a region R1, a region R2, and a region R3. The regions R1 and R2 overlap each other when viewed from the direction D shown in FIG. 4. The first holder 211a and the second holder 212a are disposed in the region R1, the first holder 211b and the second holder 212b are disposed in the region R2, and the first holder 211c and the second holder 212c are disposed in the region R3. The region R1 is an example of a first front end region, the region R2 is an example of a second front end region, and the region R3 is an example of a rear end region. The distance d is an example of the first direction. The first holder 211a is an example of a first consumable part support pad, the first holder 211b is an example of a second consumable part support pad, and the first holder 211c is an example of a third consumable part support pad. Further, the second holder 212a is an example of a first wafer support pad, the second holder 212b is an example of a second wafer support pad, and the second holder 212c is an example of a third wafer support pad.

Further, in the case of the transfer robot 20b disposed in the atmospheric transfer module 15, each of the first holders 211a to 211c and the second holders 212a to 212c may be vacuum pads that attract and hold the members by sucking air.

Figure 5:
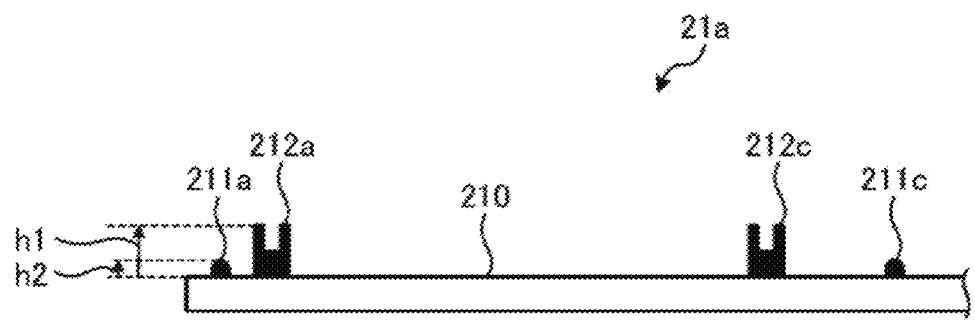
FIG. 5 is a side view indicating an example of the end effector according to the first embodiment.

FIG. 5 is a side view showing the example of the end effector 21a according to the first embodiment. Although FIG. 5 illustrates the end effector 21a included in the transfer robot 20a, the end effector 21b included in the transfer robot 20b has the same configuration. The height of the first holders 211a to 211c from the upper surface of the main body 210 is h2, and the height of the second holders 212a to 212c from the upper surface of the main body 210 is h1. In the present embodiment, h1 is higher than h2. h1 is an example of the first height, and h2 is an example of the second height.

When the edge ring ER is transferred, reaction by-products (so-called deposits) may be adhered to the transferred edge ring ER. Therefore, when the edge ring ER to which the deposits are adhered is transferred, the deposits adhered to the edge ring ER may fall onto the first holders 211a to 211c, the end effector 21a, or the like as particles.

When the wafer W is held by the first holders 211a to 211c in a state where the particles are attached to the first holders 211a to 211c or the like, the wafer W may be contaminated with particles that have fallen to the first holders 211a to 211c. In the present embodiment, however, the wafer W is not held by the first holders 211a to 211c that hold the edge ring ER, the contamination of the wafer W can be suppressed.

Further, when the height h1 of the second holders 212a to 212c is lower than or equal to the height h2 of the first holders 211a to 211c, the particles that have fallen from the edge ring ER to the first holders 211a to 211c or the end effector 21a may be re-adhered to the wafer W during the transfer of the wafer W. In the present embodiment, however, the height h1 of the second holders 212a to 212c for holding the wafer W is higher than the height h2 of the first holders 211a to 211c for holding the edge ring ER, so that the re-adhesion of the particles that have fallen on the first holders 211a to 211c or the end effector 21a to the wafer W can be suppressed.

Figure 6:
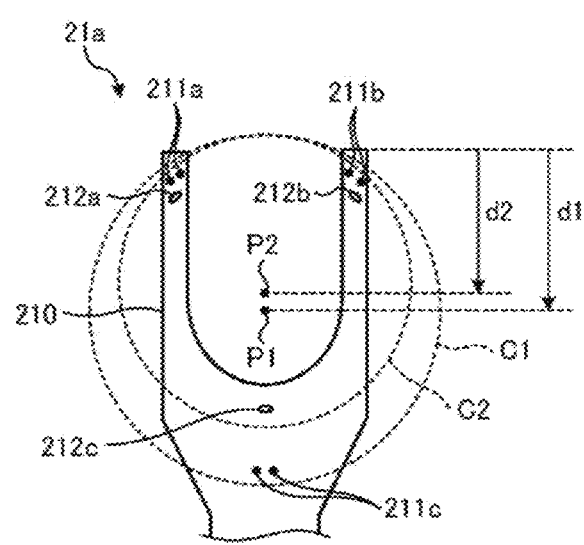
FIG. 6 is a top view showing an example of a positional relationship between a wafer and an edge ring when they are placed on the end effector in a vacuum transfer module.

FIG. 6 is a top view showing an example of a positional relationship between the wafer W and the edge ring ER when they are placed on the end effector 21a in the vacuum transfer module 11. When the edge ring ER is placed on the end effector 21a, the position of the edge ring ER is, for example, the circle C1 in FIG. 6. The position P1 indicates the center of gravity of the circle C1. In other words, the edge ring ER is placed on the end effector 21a such that the center of gravity of the edge ring ER is located at the position P1. The position P1 is an example of a first position.

When the wafer W is placed on the end effector 21a, the position of the wafer W is, for example, the circle C2 in FIG. 6. The position P2 indicates the center of gravity of the circle C2. In other words, the wafer W is placed on the end effector 21a such that the center of gravity of the wafer W is located at the position P2. The position P2 is an example of a second position. Further, as illustrated in FIG. 6, the dimension in which a part of the wafer W protrudes from the front end of the end effector 21a is the same as the dimension in which a part of the edge ring ER protrudes from the front end of the end effector 21a.

In the present embodiment, the distance d1 from the front ends of the end effector 21a to the position P1 is longer than the distance d2 from the front ends of the end effector 21a to the position P2. In other words, when the edge ring ER is transferred, the edge ring ER is placed on the end effector 21a such that the center of gravity of the edge ring ER coincides with the position P1. Further, when the wafer W is transferred, the wafer W is placed on the end effector 21a such that the center of gravity of the wafer W coincides with the position P2 between the position P1 and the front ends of the end effector 21a.

Figure 7:
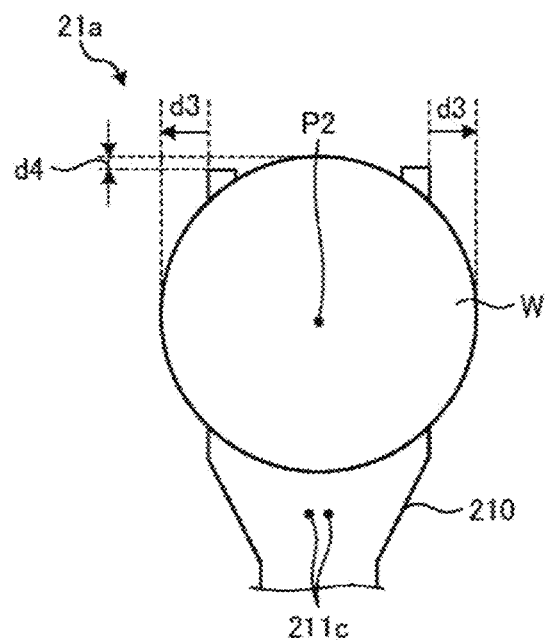
FIG. 7 is a top view showing an example of the end effector in the case of transferring the wafer in the first embodiment.
Figure 8:
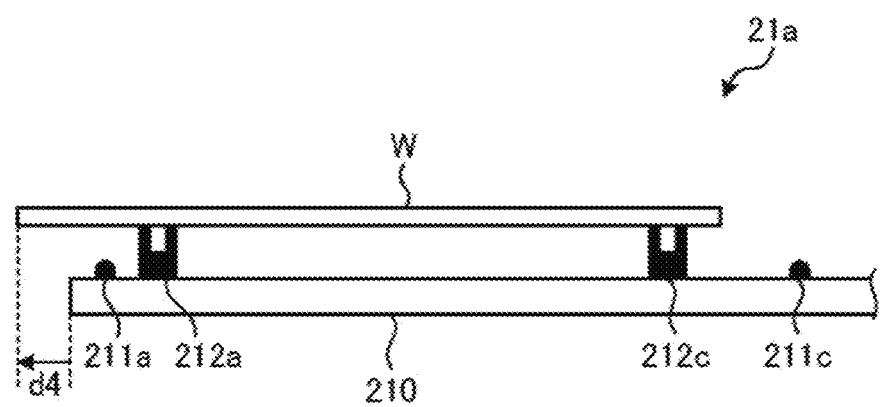
FIG. 8 is a side view explaining an example of the end effector in the case of transferring the wafer in the first embodiment.

Further, when the wafer W is transferred, the wafer W is placed on the end effector 21a as shown in FIGS. 7 and 8, for example. FIG. 7 is a top view showing the example of the end effector 21a at the time of transferring the wafer W in the first embodiment. FIG. 8 is a side view showing the example of the end effector 21a at the time of transferring the wafer W in the first embodiment. As shown in FIG. 7, for example, the width of the end effector 21a is smaller than the shape of the wafer W. Further, when the wafer W is transferred, the wafer W is placed on the end effector 21a such that the edge portion of the wafer W in the width direction of the end effector 21a is located outside the area of the end effector 21a. In the example of FIG. 7, the wafer W is placed on the end effector 21a such that the edge portion of the wafer W protrudes from the area of the end effector 21a by the distance d3 in the width direction of the end effector 21a.

When the wafer W is transferred, the wafer W is placed on the end effector 21a such that the edge portion of the wafer W in the length direction perpendicular to the width direction of the end effector 21a is located outside the area of the end effector 21a. In other words, the wafer W is placed on the end effector 21a such that a part of the wafer W protrudes from the front ends of the end effector 21a. In the example of FIG. 7, the wafer W is placed on the end effector 21a such that the edge portion of the wafer W is away from the front ends of the end effector 21a by the distance d4 in the length direction (for example, vertical direction in FIG. 7) perpendicular to the width direction of the end effector 21a.

Figure 9:
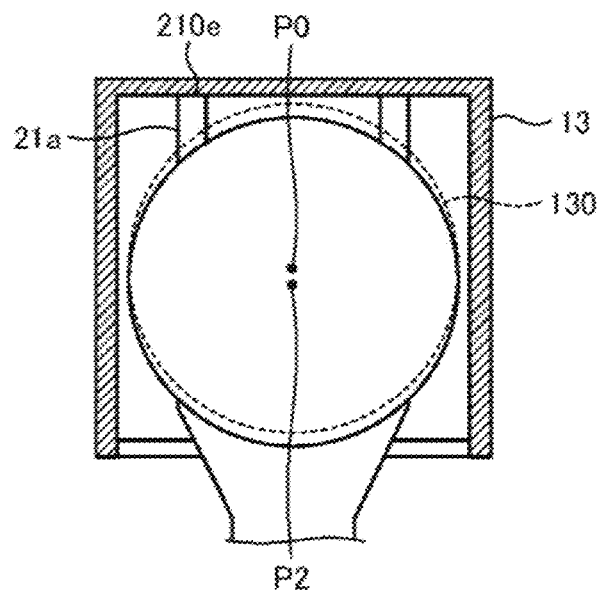
FIG. 9 shows an example of a positional relationship between the end effector and the ashing module in the case of loading the wafer into the ashing module in a comparative example.

In this specification, a case is considered as a comparative example where the wafer W is placed on the end effector 21a such that the center of gravity of the wafer W coincides with the position P1 which is the same as the position of the center of gravity of the edge ring ER placed on the end effector 21a. In this case, as shown in FIG. 9, for example, since the front ends 210e of the end effector 21a get in contact with a sidewall of the ashing module 13, it is difficult to load the wafer W into the ashing module 13 such that the center of gravity of the wafer W coincides with the center position P0 of the stage 130. The front ends 210e of the end effector 21a will be obstructive in a container accommodating the wafer W only, such as the load-lock module 14 or the like, as well as in the ashing modules 13, thereby blocking the wafer W from being loaded to a predetermined position in the container. In addition, when the wafer W is loaded to the FOUP by the end effector 21b of the transfer robot 20b, since the front ends 210e of the end effector 21b will be obstructive, it is difficult to load the wafer W into a predetermined position in the FOUP.

Figure 10:
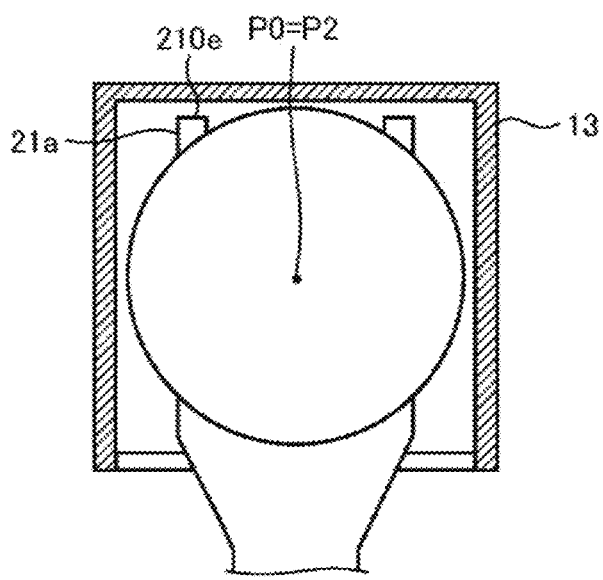
FIG. 10 depicts an example of a positional relationship between the end effector and the ashing module in the case of loading the wafer into the ashing module in an embodiment of the present disclosure.

In the present embodiment, however, the wafer W is placed on the end effector 21a such that the center of gravity of the wafer W is located at the position P2 between the position P1 and the front ends of the end effector 21a, not at the position P1 which is the position of the center of gravity of the edge ring ER at the time of transferring the edge ring ER. Accordingly, as shown in FIG. 10, for example, the wafer W can be loaded into the ashing module 13 such that the center of gravity of the wafer W coincides with the center position P0 of the stage 130. The wafer W can be loaded into a predetermined position in a container accommodating the wafer W only, such as the load-lock module 14 or the like, as well as in the ashing module 13. In addition, in the present embodiment, when the wafer W is loaded to the FOUP by the end effector 21b of the transfer robot 20b, it is possible to load the wafer W into a predetermined position in the FOUP.

Figure 11:
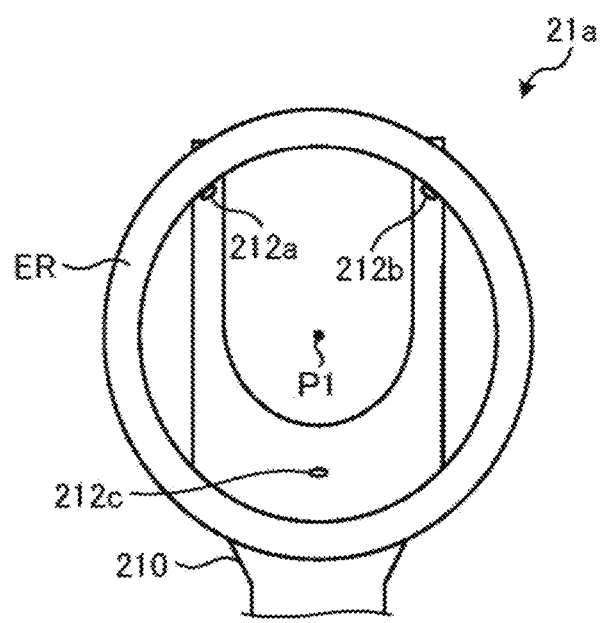
FIG. 11 is a top view showing an example of the end effector in the case of transferring the edge ring in the first embodiment.
Figure 12:
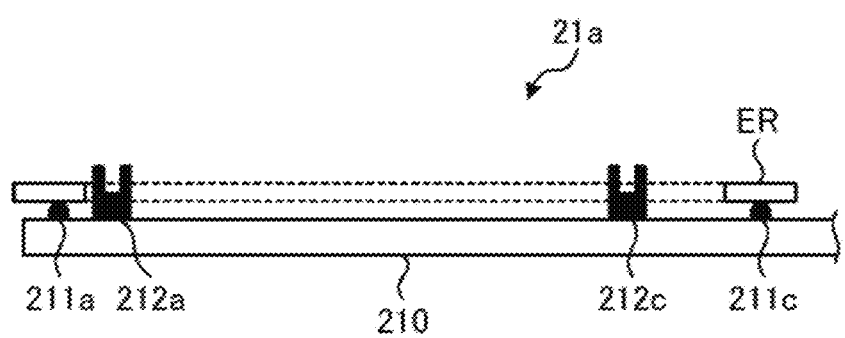
FIG. 12 is a side view representing an example of the end effector in the case of transferring the edge ring in the first embodiment.

When the edge ring ER is transferred, the edge ring ER is placed on the end effector 21a as shown in FIGS. 11 and 12, for example. FIG. 11 is a top view showing the example of the end effector 21a at the time of transferring the edge ring ER in the first embodiment. FIG. 12 is a side view showing the example of the end effector 21a at the time of transferring the edges ring ER in the first embodiment. Although FIGS. 11 and 12 illustrates the end effector 21a included in the transfer robot 20a, the end effector 21b included in the transfer robot 20b has the same configuration. For example, as shown in FIGS. 11 and 12, when the edge ring ER is placed on the end effector 21a, a part of the edge ring ER protrudes from the front ends of the end effector 21a. In the present embodiment, since the edge ring ER is an annular member, it is difficult to place the edge ring ER on the front end side of the end effector 21a. Therefore, in the present embodiment, the edge ring ER is placed on the end effector 21a such that the center of gravity of the edge ring ER is located at the position P1 far from the front ends of the end effector 21a, not at the position P2 which is the position of the center of gravity of the wafer W at the time of transferring the wafer W. Accordingly, the end effector 21a can transfer the edge ring ER in a stable manner.

(Transfer Method)

Figure 13:
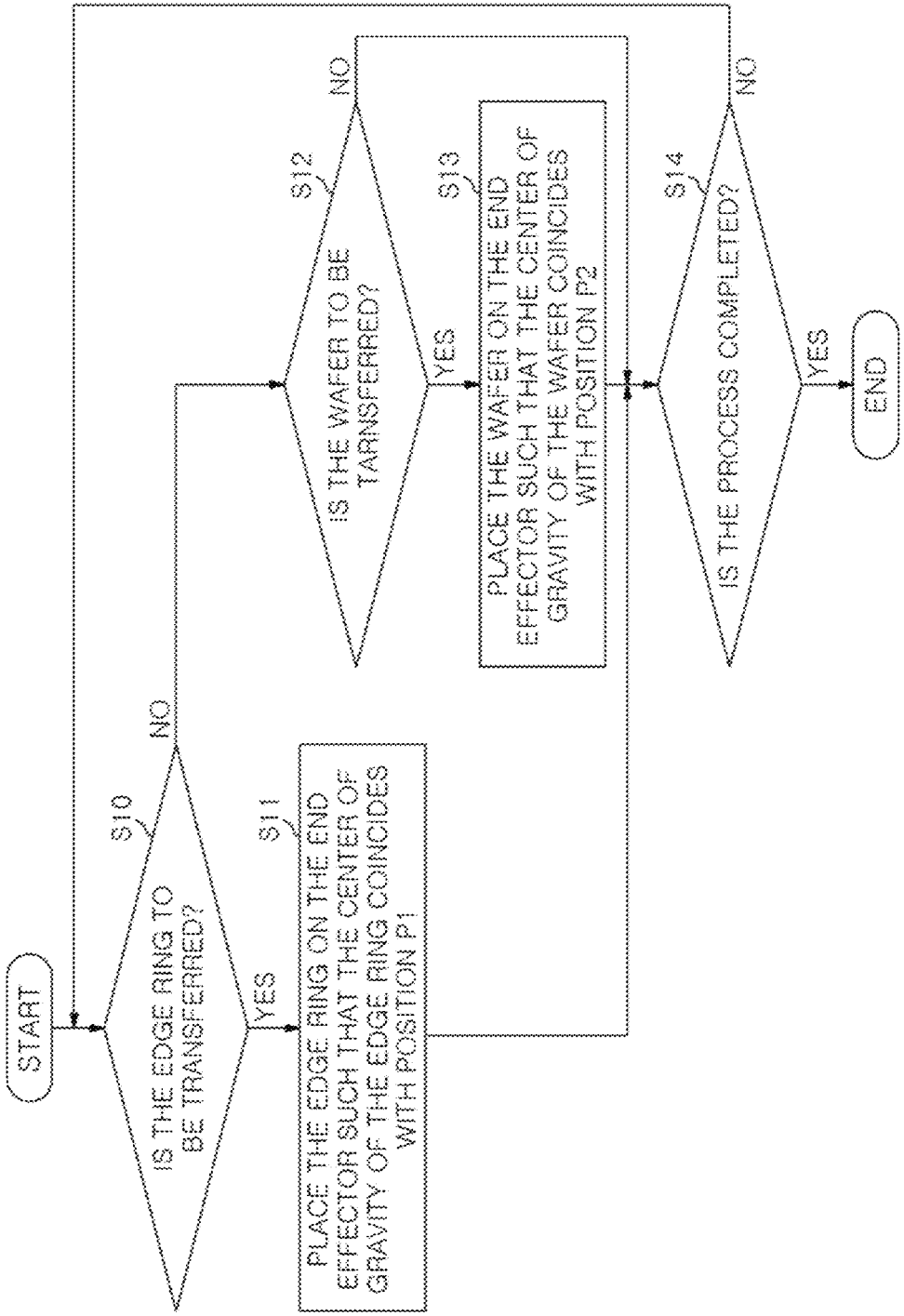
FIG. 13 is a flowchart indicating an example of a transfer method in the first embodiment.

FIG. 13 is a flowchart showing an example of a transfer method according to the first embodiment. The processing illustrated in the flowchart of FIG. 13 may be performed by controlling the individual components of the apparatus main body 10 under the control of the controller 100. Hereinafter, the operation of the transfer robot 20a in the vacuum transfer module 11 will be described as an example, but the same applies to the operation of the transfer robot 20b in the atmospheric transfer module 15.

First, the controller 100 determines whether or not to transfer the edge ring ER (S10). When the edge ring ER is transferred (S10: Yes), the controller 100 places the edge ring ER on the end effector 21a such that the center of gravity of the edge ring ER coincides with the position P1 (S11). For example, the controller 100 controls the arm 22a of the transfer robot 20a to place the edge ring ER on the end effector 21a such that the center of gravity of the edge ring ER coincides with the position P1. Step S11 is an example of process a). Then, the controller 100 carries out the processing shown in step S14.

On the other hand, when the edge ring ER is not transferred (S10: No), the controller 100 determines whether or not to transfer the wafer W (S12). When the wafer W is not transferred (S12: No), the controller 100 performs the processing shown in step S14.

On the other hand, when the wafer W is transferred (S12: Yes), the controller 100 places the wafer W on the end effector 21a such that the center of gravity of the wafer W coincides with the position P2 (S13). For example, the controller 100 controls the arm 22a of the transfer robot 20a to place the wafer W on the end effector 21a such that the center of gravity of the wafer W coincides with the position P2. Step S13 is an example of process b).

Then, the controller 100 determines whether or not the processing of a predetermined number of wafers W is completed (S14). If the processing of the predetermined number of wafers W is not completed (S14: No), the processing shown in step S10 is executed again. On the other hand, when the processing of the predetermined number of wafers W is completed (S14: Yes), the transfer method shown in the flowchart is terminated.

Figure 14:
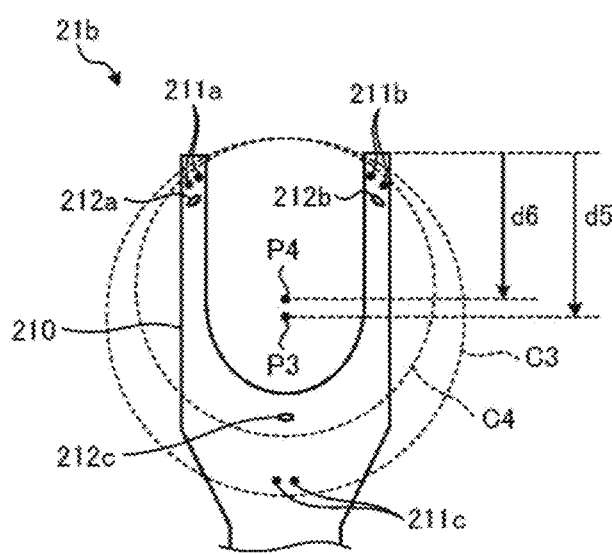
FIG. 14 is a top view showing an example of a positional relationship between the wafer and the edge ring when they are placed on the end effector in an atmospheric transfer module.

In the above-described embodiment, the case where the wafer W and the edge ring ER are placed on the end effector 21a has been mainly described, but the disclosed technique is not limited to this, and the wafer W and the edge ring ER are also placed in the end effector 21b. FIG. 14 is a top view showing an example of a positional relationship between the wafer W and the edge ring ER when they are placed on the end effector 21b in the atmospheric transfer module 15. When the edge ring ER is placed on the end effector 21b, the position of the edge ring ER is, for example, the circle C3 in FIG. 14. The center of gravity of the circle C3 is the position P3. In other words, when the edge ring ER is placed on the end effector 21b, the edge ring ER is placed on the end effector 21b such that the center of gravity of the edge ring ER is at the position P3. The position P3 is an example of a third position.

When the wafer W is placed on the end effector 21b, the position of the wafer W is, for example, the circle C4 in FIG. 14. The center of gravity of the circle C4 is the position P4. In other words, when the wafer W is placed on the end effector 21b, the wafer W is placed on the end effector 21b such that the center of gravity of the wafer W is at the position P4. The position P4 is an example of a fourth position.

Further, the distance d5 from the front ends of the end effector 21b to the position P3 is longer than the distance d6 from the front ends of the end effector 21b to the position P4. In other words, when the edge ring ER is transferred, the edge ring ER is placed on the end effector 21b such that the center of gravity of the edge ring ER coincides with the position P3. Further, when the wafer W is transferred, the wafer W is placed on the end effector 21b such that the center of gravity of the wafer W coincides with the position P4 between the position P3 and the front ends of the end effector 21b.

As described above, the transfer robot 20 of the present embodiment transfers the wafer W and the edge ring ER which is an example of a consumable part having a circular shape. The transfer robot 20 includes the end effector 21, the arm 22, and the controller 100. The edge ring ER can be disposed in the processing module 12, and the outer diameter of the edge ring ER is larger than the outer diameter of the wafer W. The end effector 21 is configured to place the wafer W and the edge ring ER thereon. The arm 22 is configured to move the end effector 21. In the case of transferring the edge ring ER, the controller 100 controls the arm 22 to place the edge ring ER on the end effector 21 such that the center of gravity of the edge ring ER coincides with the position P1. Further, in the case of transferring the wafer W, the controller 100 controls the arm 22 to place the wafer W on the end effector 21 such that the center of gravity of the wafer W coincides with the position P2 between the position P1 and the front ends of the end effector 21. Thus, it is possible to transfer the wafer W to the ashing module 13 or the like having no space for accommodating the edge ring ER, so that the ashing module 13 or the like can be scaled down. Accordingly, the footprint of the entire processing system 1 can be decreased.

In the above-described embodiment, the width of the end effector 21 is smaller than the shape of the wafer W. Further, in the case of transferring the wafer W, the wafer W is placed on the end effector 21 such that a part of the wafer W protrudes from the front ends of the end effector 21. Accordingly, the end effector 21 can load the wafer W into the ashing module 13 or the like having no space for accommodating the edge ring ER.

Further, in the above-described embodiment, when the edge ring ER is transferred, the edge ring ER is placed on the end effector 21 such that a part of the edge ring ER protrudes from the front ends of the end effector 21. As a result, the depth of the processing module 12 into which the edge ring ER is loaded can be reduced.

Further, in the above-described embodiment, the dimension in which a part of the wafer W protrudes from the front ends of the end effector 21 is the same as the dimension in which a part of the edge ring ER protrudes from the front ends of the end effector 21.

In the above-described embodiment, the edge ring ER which is an example of a consumable part is an annular member. The end effector 21 includes the main body 210 having an upper surface, and the plurality of first holders 211a to 211c and the plurality of second holders 212a to 212c disposed on the upper surface of the main body 210. The height h1 of the second holders 212a to 212c from the upper surface of the main body 210 is higher than the height h2 of the first holders 211a to 211c from the upper surface of the main body 210. Accordingly, it is possible to suppress the re-adhesion of the particles adhered to the first holders 211a to 211c or the end effector 21 to the wafer W.

The processing system 1 in the above-described embodiment includes the vacuum transfer module 11, at least one processing module 12, at least one ashing module 13, and the transfer robot 20a. The processing module 12 and the ashing module 13 are connected to the vacuum transfer module 11. The transfer robot 20a is disposed in the vacuum transfer module 11 and transfers the wafer W and the edge ring ER, which is an example of a consumable part having a circular shape, in a vacuum atmosphere. The edge ring ER can be disposed in at least one processing module 12. The outer diameter of the edge ring ER is larger than the outer diameter of the wafer W. The transfer robot 20a includes the end effector 21a configured to place the wafer W and the edge ring ER thereon. The end effector 21a is configured to place the edge ring ER on the end effector 21a such that the center of gravity of the edge ring ER coincides with the position P1. Further, the end effector 21a is configured to place the wafer W on the end effector 21a such that the center of gravity of the wafer W coincides with the position P2 between the position P1 and the front ends 210e of the end effector 21a. Accordingly, it is possible to load the wafer W into the ashing module 13 or the like having no space for accommodating the edge ring ER, and also possible to scale down the ashing modules 13 or the like. Hence, the footprint of the entire processing system 1 can be reduced.

Further, in the above-described embodiment, the edge ring ER is an annular part. The end effector 21a includes the main body 210, and the first holders 211a to 211c and the second holders 212a to 212c. The main body 210 has the upper surface having the region R1, the region R2, and the region R3. The region R1 and the region R2 overlap each other when viewed from the distance d. The second holder 212a is disposed in the region R1, the second holder 212b is disposed in the region R2, and the second holder 212c is disposed in the region R3. The height of the second holders 212a to 212c is h1. The first holder 211a is disposed between the second holder 212a and the front ends 210e of the end effector 21a in the region R1, the first holder 211b is disposed between the second holder 212b and the front ends 210e of the end effector 21a in the region R2, the first holder 211c is disposed between the second holder 212c and a rear end of the end effector 21a in the region R3. The height of the first holders 211a to 211c is h2, which is lower than h1. Accordingly, it is possible to suppress the re-adhesion of the particles adhered to the first holders 211a to 211c or the end effector 21a to the wafer W.

Further, the processing system 1 in the above-described embodiment further includes at least one load-lock module 14, the atmospheric transfer module 15, and the transfer robot 20b. The load-lock module 14 is connected to the vacuum transfer module 11, and the atmospheric transfer module 15 is connected to the load-lock module 14. The transfer robot 20b is disposed in the atmospheric transfer module 15 and transfers the wafer W and the edge ring ER, which is an example of a consumable part, in an atmospheric pressure atmosphere. The transfer robot 20b includes the end effector 21b configured to place the wafer W and the edge ring ER thereon. The end effector 21b is configured to place the edge ring ER on the end effector 21b such that the center of gravity of the edge ring ER coincides with the position P3. Further, the end effector 21b is configured to place the wafer W on the end effector 21b such that the center of gravity of the wafer W coincides with the position P4 between the position P3 and the front ends of the end effector 21b. As a result, the wafer W can be loaded into a container such as a FOUP that has no space for accommodating the edge ring ER.

Further, the end effector 21a in the above-described embodiment places the wafer W and the edge ring ER which is an example of a consumable part having a circular shape thereon. The outer diameter of the edge ring ER is larger than the outer diameter of the wafer W. The end effector 21a includes the main body 210, and the first holders 211a to 211c and the second holders 212a to 212c. The main body 210 has the upper surface having the region R1, the region R2, and the region R3. The region R1 and the region R2 overlap each other when viewed from the distance d. The second holder 212a is disposed in the region R1, the second holder 212b is disposed in the region R2, and the second holder 212c is disposed in the region R3. The height of the second holders 212a to 212c is h1. The first holder 211a is disposed between the second holder 212a and the front ends 210e of the end effector 21a in the region R1, the first holder 211b is disposed between the second holder 212b and the front ends 210e of the end effector 21a in the region R2, and the first holder 211c is disposed between the second holder 212c and the rear end of the end effector 21a in the region R3. The height h1 of the second holders 212a to 212c and the height h2 of the first holders 211a to 211c are different heights. When the edge ring ER is transferred, the end effector 21a is configured to place the edge ring ER on the end effector 21a such that the center of gravity of the edge ring ER coincides with the position P1. Further, when the wafer W is transferred, the end effector 21a is configured to place the wafer W on the end effector 21a such that the center of gravity of the wafer W coincides with the position P2 between the position P1 and the front ends 210e of the end effector 21a. Accordingly, it is possible to suppress the re-adhesion of the particles adhered to the first holders 211a to 211c or the end effector 21a to the wafer W.

Further, in the above-described embodiment, the edge ring ER is an annular part, and the height h1 of the second holders 212a to 212c is higher than the height h2 of the first holders 211a to 211c. Accordingly, it is possible to suppress the re-adhesion of the particles adhered to the first holders 211a to 211c or the end effector 21a to the wafer W.

Second Embodiment

The transfer robot 20a and the transfer robot 20b in the first embodiment separately transfer the wafer W and the edge ring ER, which is an example of a consumable part. On the other hand, the transfer robot 20a and the transfer robot 20b of the present embodiment can simultaneously transfer the wafer W and the edge ring ER. Hereinafter, the points different from those of the first embodiment will be mainly described.

Figure 15:
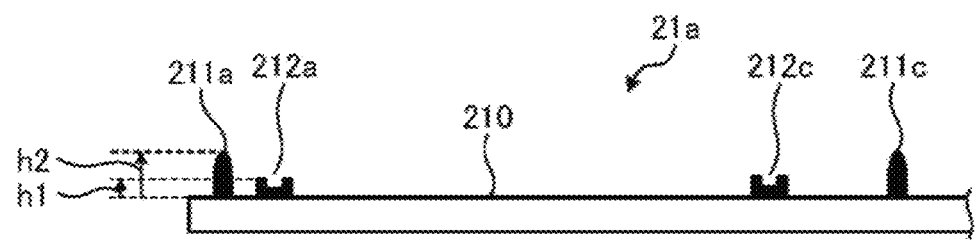
FIG. 15 is a side view showing another example of the end effector according to a second embodiment.
Figure 16:
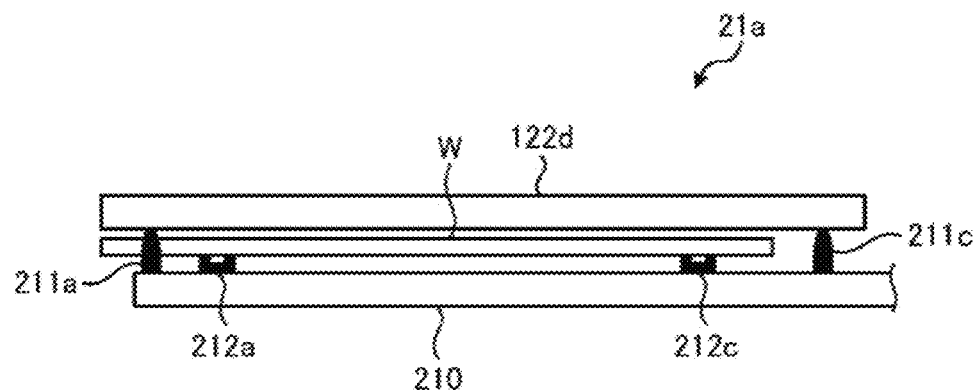
FIG. 16 is a side view showing an example of the end effector in the case where the wafer and the edge ring are simultaneously transferred in the second embodiment.

FIG. 15 is a side view showing another example of the end effector 21a according to a second embodiment. In FIG. 15, the end effector 21a included in the transfer robot 20a is illustrated, but the end effector 21b included in the transfer robot 20b has the same configuration. In the present embodiment, the height h1 of the second holders 212a to 212c from the upper surface of the main body 210 is lower than the height h2 of the first holders 211a to 211c from the upper surface of the main body 210, for example, as shown in FIG. 15. As a result, as shown in FIG. 16, for example, it is possible to place simultaneously a non-annular (non-hollow) consumable part, such as the cover member 122d and the electrostatic chuck 121a of the chamber 120, and the wafer W on the end effector 21a without interfering each other. In the end effector 21a of the present embodiment, it is also possible to simultaneously transfer an annular consumable part such as the edge ring ER and the wafer W.

Figure 17:
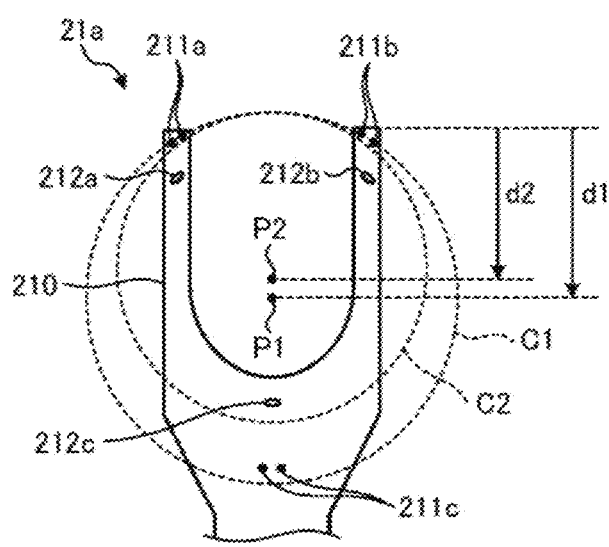
FIG. 17 is a top view showing an example of a positional relationship between the wafer and the edge ring when they are simultaneously transferred in the second embodiment.

In the end effector 21a of the present embodiment, for example, as shown in FIG. 17, the first holder 211a and the first holder 211b that support the consumable part are disposed outside the circle C2 indicating the position of the wafer W. As a result, the end effector 21a can simultaneously place the wafer W and the consumable part thereon without the first holders 211a and 211b and the wafer W interfering with each other.

(Others)

Note that the technique disclosed in the present disclosure is not limited to the above-described embodiment, and many modifications can be made within the scope of the gist thereof.

For example, in each of the above-described embodiments, the shape of the consumable part is circular, but the disclosed technique is not limited to this, and the shape of the consumable part may be a shape other than a circle, such as a rectangular shape, a polygonal shape, and a shape whose part is an arc.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A transfer device for simultaneously or separately transferring a wafer and a consumable part having a circular shape,
wherein the consumable part is disposed in a wafer processing module, and the outer diameter of the consumable part is larger than the outer diameter of the wafer,
the transfer device comprising:
an end effector configured to place the wafer and the consumable part thereon simultaneously or separately, the end effector including a plurality of wafer support pads disposed on the upper surface of the main body;
an arm configured to move the end effector; and
circuitry configured to:
control the arm,
place the consumable part on the end effector such that the center of gravity of the consumable part coincides with a first position, in the case of transferring the consumable part, and
place the wafer on the end effector such that the center of gravity of the wafer coincides with a second position between the first position and front ends of the end effector, in the case of transferring the wafer, and
the plurality of wafer support pads are vacuum pads configured to attract and hold members by sucking air.

2. The transfer device of claim 1, wherein the width of the end effector is smaller than the wafer.

3. The transfer device of claim 1, wherein the wafer is placed on the end effector such that a part of the wafer protrudes from the front ends of the end effector, in the case of transferring the wafer.

4. The transfer device of claim 3, wherein the consumable part is placed on the end effector such that a part of the consumable part protrudes from the front ends of the end effector, in the case of transferring the consumable part.

5. The transfer device of claim 4, wherein the dimension in which a part of the wafer protrudes from the front ends of the end effector is the same as the dimension in which a part of the consumable part protrudes from the front ends of the end effector.

6. The transfer device of claim 1, wherein the consumable part is an annular part,
the end effector includes:
a main body having an upper surface; and
a plurality of consumable part support pads disposed on the upper surface of the main body,
the height of each wafer support pad from the upper surface of the main body is higher than the height of the consumable part support pad from the upper surface of the main body, and
each of the consumable part support pads are vacuum pads configured to attract and hold members by sucking air.

7. The transfer device of claim 1, wherein the consumable part is a cover member or an electrostatic chuck disposed under a shower head,
the end effector includes:
a main body having an upper surface; and
a plurality of consumable part support pads disposed on the upper surface of the main body,
the height of each wafer support pad from the upper surface of the main body is lower than the height of the consumable part support pad from the upper surface of the main body, and
each of the consumable part support pads are vacuum pads configured to attract and hold members by sucking air.

8. A transfer system comprising:
a vacuum transfer module;
at least one first wafer processing module connected to the vacuum transfer module;
at least one second wafer processing module connected to the vacuum transfer module; and
a vacuum transfer robot disposed in the vacuum transfer module for simultaneously or separately transferring a wafer and a circular consumable part in a vacuum atmosphere,
wherein the consumable part is disposed in said at least one first wafer processing module,
the outer diameter of the consumable part is larger than the outer diameter of the wafer,
the vacuum transfer robot includes an end effector configured to place the wafer and the consumable part thereon simultaneously or separately,
the end effector is configured to place the consumable part on the end effector such that the center of gravity of the consumable part coincides with a first position, and to place the wafer on the end effector such that the center of gravity of the wafer coincides with a second position between the first position and front ends of the end effector,
the end effector includes:
a first wafer support pad disposed in a first front end region and having a first height;
a second wafer support pad disposed in a second front end region and having the first height;
a third wafer support pad disposed in a rear end region and having the first height, and
the first wafer support pad, the second wafer support pad and the third wafer support pad are vacuum pads configured to attract and hold members by sucking air.

9. The transfer system of claim 8, wherein the consumable part is an annular part,
the end effector includes:
a main body having an upper surface having the first front end region, the second front end region, and the rear end region, wherein the first front end region and the second front end region overlap each other when viewed from a first direction;
a first consumable part support pad disposed between the first wafer support pad and front ends of the end effector in the first front end region and having a second height lower than the first height;
a second consumable part support pad disposed between the second wafer support pad and the front ends of the end effector in the second front end region and having the second height; and
a third consumable part support pad disposed between the third wafer support pad and a rear end of the end effector in the rear end region and having the second height, and
the first consumable part support pad, the second consumable part support pad and the third consumable part support pad are vacuum pads configured to attract and hold members by sucking air.

10. The transfer system of claim 8, wherein the consumable part is a cover member or an electrostatic chuck disposed under a shower head,
the end effector includes:
a main body having an upper surface having a first front end region, a second front end region, and a rear end region, wherein the first front end region and the second front end region overlap each other when viewed from a first direction;
a first consumable part support pad disposed between the first wafer support pad and front ends of the end effector in the first front end region and having a second height higher than the first height;
a second consumable part support pad disposed between the second wafer support pad and the front ends of the end effector in the second front end region and having the second height; and
a third consumable part support pad disposed between the third wafer support pad and a rear end of the end effector in the rear end region and having the second height, and
the first consumable part support pad, the second consumable part support pad and the third consumable part support pad are vacuum pads configured to attract and hold members by sucking air.

11. The transfer system of claim 8, further comprising:
at least one load-lock module connected to the vacuum transfer module;
an atmospheric transfer module connected to said at least one load-lock module; and
an atmospheric transfer robot disposed in the atmospheric transfer module for simultaneously or separately transporting the wafer and the consumable part in an atmospheric pressure atmosphere,
wherein the atmospheric transfer robot includes an additional end effector configured to place the wafer and the consumable part thereon simultaneously or separately, and
the additional end effector is configured to place the consumable part on the additional end effector such that the center of gravity of the consumable part coincides with a third position, and to place the wafer on the additional end effector such that the center of gravity of the wafer coincides with a fourth position between the third position and front ends of the additional end effector.

12. An end effector for placing a wafer and a consumable part having a circular shape thereon simultaneously or separately, wherein the outer diameter of the consumable part is larger than the outer diameter of the wafer, the end effector comprising:

a main body having an upper surface having a first front end region, a second front end region, and a rear end region, wherein the first front end region and the second front end region overlap each other when viewed from a first direction;

a first wafer support pad disposed in the first front end region and having a first height;

a second wafer support pad disposed in the second front end region and having the first height;

a third wafer support pad disposed in the rear end region and having the first height;

a first consumable part support pad disposed between the first wafer support pad and front ends of the end effector in the first front end region and having a second height different from the first height;

a second consumable part support pad disposed between the second wafer support pad and the front ends of the end effector in the second front end region and having the second height; and a third consumable part support pad disposed between the third wafer support pad and a rear end of the end effector in the rear end region and having the second height, the end effector is configured to place the consumable part on the end effector such that the center of gravity of the consumable part coincides with a first position in the case of transferring the consumable part, and to place the wafer on the end effector such that the center of gravity of the wafer coincides with a second position between the first position and the front ends of the end effector in the case of transferring the wafer, and the first wafer support pad, the second wafer support pad and the third wafer support pad are vacuum pads configured to attract and hold members by sucking air.

13. The end effector of claim 12, wherein the consumable part is an annular part, and the first height is higher than the second height to allow the end effector to simultaneously hold the wafer and the consumable part.

14. The end effector of claim 12, wherein the consumable part is a cover member or an electrostatic chuck disposed under a shower head, and the first height is lower than the second height to allow the end effector to simultaneously hold the wafer and the consumable part.

* * * * *